United States Patent [19]

Fränkel et al.

[11] Patent Number: 4,853,252

[45] Date of Patent: Aug. 1, 1989

[54] METHOD AND COATING MATERIAL FOR APPLYING ELECTRICALLY CONDUCTIVE PRINTED PATTERNS TO INSULATING SUBSTRATES

[75] Inventors: Juergen Fränkel, Baldham, Fed. Rep. of Germany; Antoon Mattelin, Oostkamp; Pol Pecceu, Brugge, both of Belgium; Ferdinand Quella, Neubiberg; Hans-Fr. Schmidt, Eurasburg, both of Fed. Rep. of Germany; Luc Boone, Oostkamp, Belgium; Sybille Von Tomkewitsch, Poecking, Fed. Rep. of Germany; Marc De Vogelaere, Zedelgem, Belgium

[73] Assignees: Siemens Aktiengesellschaft, Berlin and Munich; Michael Huber GmbH, Heimstetten, both of Fed. Rep. of Germany

[21] Appl. No.: 128,186

[22] Filed: Dec. 3, 1987

[30] Foreign Application Priority Data

Dec. 17, 1986 [DE] Fed. Rep. of Germany ....... 3643130

[51] Int. Cl.$^4$ .................... B05D 3/06; B05D 5/12; C25D 5/02
[52] U.S. Cl. .................... 427/53.1; 106/1.21; 204/38.4; 427/98; 427/126.5; 427/443.1
[58] Field of Search ........ 427/53.1, 304–306, 427/96, 98, 443.1, 126.5; 106/1.21; 204/15, 38.4

[56] References Cited

U.S. PATENT DOCUMENTS 3,674,515  7/1922  Kelemen ............... 106/1.21
4,486,463 12/1984  Rubner et al. ......... 427/53.1
4,574,095  3/1986  Baum et al. ........... 427/53.1
4,716,059 12/1987  Kim .................. 106/1.21 X

FOREIGN PATENT DOCUMENTS 2250318  9/1972  France .
2160070 11/1972  France .
8403586  9/1984  PCT Int'l Appl. .

OTHER PUBLICATIONS

German Periodical Galvanotechnik 77 (1986), No. 1, pp. 51–60.
IBM Technical Disclosure Bulletin, vol. 15, No. 5, Feb. 1973, p. 2855.

Primary Examiner—Michael Lusignan
Attorney, Agent, or Firm—Hill, Van Santen, Steadman & Simpson

[57] ABSTRACT

A method and coating material for applying electrically conductive printed patterns to insulating substrates is provided. The coating material includes a non-metallic, grainy carrier substance having metal of the oxidation degree 0 applied thereto. An energy radiation source, particularly of a deflectable laser beam, is used to secure anchoring of the carrier substance to the substrate in the region of the desired printed pattern. As a consequence of a three-dimensional arrangement of the metal, a three-dimensional nuclei distribution is produced that leads to a reliable and fast metallization of the printed pattern on the basis of chemical metal deposition. The method of the invention is especially suited for laser pattern transfer for the manufacture of printed circuit boards.

49 Claims, 2 Drawing Sheets

METHOD AND COATING MATERIAL FOR APPLYING ELECTRICALLY CONDUCTIVE PRINTED PATTERNS TO INSULATING SUBSTRATES

BACKGROUND OF THE INVENTION

The present invention relates generally to a method of applying electrically conductive printed patterns to electrically insulating substrates. More particularly, the present invention relates to a method of applying electrically conductive printed patterns, particularly conductor patterns, to electrically insulating substrates, whereby a metal-containing coating agent is transferred onto the substrate in an arrangement corresponding to the printed pattern to be generated. The coating agent is transferred under the influence of energy radiation, and is chemically metallized. The present invention also relates to a metal-containing coating agent for the application of such printed patterns to electrically insulating substrates.

German periodical "Galvanotechnik" 77 (1986) No. 1, pages 51 through 60, discloses a method for applying conductor patterns to electrically conductive (SIC) substrates wherein the transfer of the conductor pattern is undertaken with the assistance of a laser. To this end, adhesive-coated epoxy resin base material is employed as a substrate. This substrate is subjected to pretreatment with $SO_3$ vapor phase etching with a $NH_3$ etching stop for roughening the adhesive. A Cr (III) photosensitizer which contains chrome (III)-chloride, sodium oxalate and palladium (II)-chloride, for example, is then applied to the substrate as a metal-containing coating agent. Pd nuclei is generated in the region of the conductor pattern in the following laser image transfer, these Pd nuclei enabling a chemical or galvanic thick copper-plating after a premetallization with Ni-P and a heat treatment at 100° to about 120° C. Due to a thick copper-plating in copper baths working without external current and given longer exposition times, disociations of the adhesive layer from the base material can occur so that the deposited interconnects lose their adhesive foundation.

"IBM Technical Disclosure Bulletin", Vol. 15, No. 9, February 1973, page 2855, discloses a method for applying conductor patterns to ceramic substrates. The method includes applying to a green ceramic substrate a metal-containing thermoplastic powder that is subsequently exposed to a laser beam in accord with the desired conductor pattern. The laser beam melts the thermoplastic powder embedding and adhering the metal particles to the ceramic substrate. Remaining metal-containing powder that was not exposed to the laser beam can then be removed with an air jet.

These prior methods have not been entirely satisfactory. In producing conductor patterns on a substrate, numerous considerations must be taken into account. It is desirable to reduce the exposition time. Further, it is necessary for the electrically conductive pattern to be sufficiently anchored. Some previous methods of producing conductor patterns on a substrate have not been entirely satisfactory because they utilize decomposition reactions that produce environmental pollution. Some previous methods of producing these conductor patterns suffer the disadvantage of being costly.

There is therefore a need for an improved method of producing conductor patterns on a substrate, as well as an improved metal-containing coating agent for the application of such printed patterns of a substrate.

SUMMARY OF THE INVENTION

The present invention provides an improved method for applying electrically conductive printed patterns, particularly conductor patterns, to electrically insulating substrates. The method enables a simple transfer of the printed pattern and, particularly in the manufacture of printed circuit boards, guarantees the production of extremely fine conductor structures having an adequate adhesive foundation. The present invention further provides a metal-containing coating agent suitable for being applied to substrates to create a desired conductor pattern.

In an embodiment of the present invention, the coating material comprises a non-metallic, grainy carrier substance with metal of the oxidation degree 0 applied thereon.

The present invention is based, in part, on the discovery that the decomposition of metallo-organic compounds, induced by energy radiation, can be avoided by employing metal of the oxidation degree 0, insofar as the metal can be prepared in a way that is suitable for the transfer of the printed pattern and for the firm anchoring on or in the substrate. This preparation of metal having the oxidation degree 0 ensues by utilizing a non-metallic grainy carrier substance on which the metal is applied in a finely distributed form. Such carrier substances for metals of the oxidation degree 0 are known and are referred to as carrier catalysts which, for example, are utilized by hydration or dehydration. In the manufacture of such carrier catalysts, catalytic metals such as platinum, palladium, and nickel are precipitated on catalyst carriers such as activated carbon, diatomaceous earth, bentonite, kaolin, silica gel, aluminum oxide, and pumice stone. Commercially available carrier catalysts generally contain between approximately 0.5 to about 60 weight percent metal.

As a result of utilizing the coating agent of the present invention, a three-dimensional distribution of the metal nuclei is produced on the substrate. This three-dimensional distribution promotes chemical metallization and considerably reduces the exposition times in the corresponding baths working without external current. Further, the grainy carrier substances of the coating agent of the present invention afford a very good anchoring in the substrate which is controllable through the use of energy radiation. The anchoring guarantees an excellent adhesive foundation for the interconnects in, for example, the manufacture of printed circuit boards.

The present invention provides as a further advantage reduced environmental pollution due to the elimination of the previously required decomposition reactions. The present invention also affords a more economical process for applying electrically conductive printed patterns to substrates due to the simplification of the process, and the ability to process the coating material in liquid form. The ability to process the coating material in liquid form is achieved because the metals bonded to the carrier substances can be dispersed very well in liquids and lead to stable liquid coating agents.

The present invention also provides a metal-containing coating agent for applying electrically conductive printed patterns, particularly conductor patterns to electrically insulating substrates. The metal, in the metal-containing coating, is in the oxidation degree 0 and is applied to a non-metallic, grainy carrier substance. The above stated advantages are achieved by employing the coating agent of the present invention in the pattern transfer with energy beams.

The method and coating agent of the present invention fundamentally enables a multitude of processing and transfer forms. Thus, the coating agent can be utilized in solid form as a powder with or without a bonding agent, in a liquid form, or in the form of a foil to be applied to the surface of a substrate. The foil can be composed only of the coating agent or can be composed of the coating agent and of an auxiliary carrier. If a foil is used, the transfer of the printed patterns with the foil can proceed, for example, as set forth in French Published Application No. 2 250 318.

Pursuant to the method of the present invention, the printed patterns can be transferred, through the use of energy radiation, in a variety of manners. In addition to the utilization of masks, dies and the like, the printed patterns can also be produced by relative movements between energy beam and substrate. It should be noted that the term "transfer of printed patterns" includes the surface-wide metallizations of substrates. In this embodiment, subtractive techniques can also be utilized.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

The present invention provides an improved method for applying electrically conductive printed patterns to insulating substrates The present invention also provides a coating material for applying electrically conductive printed patterns to insulating substrates.

Figure 1:
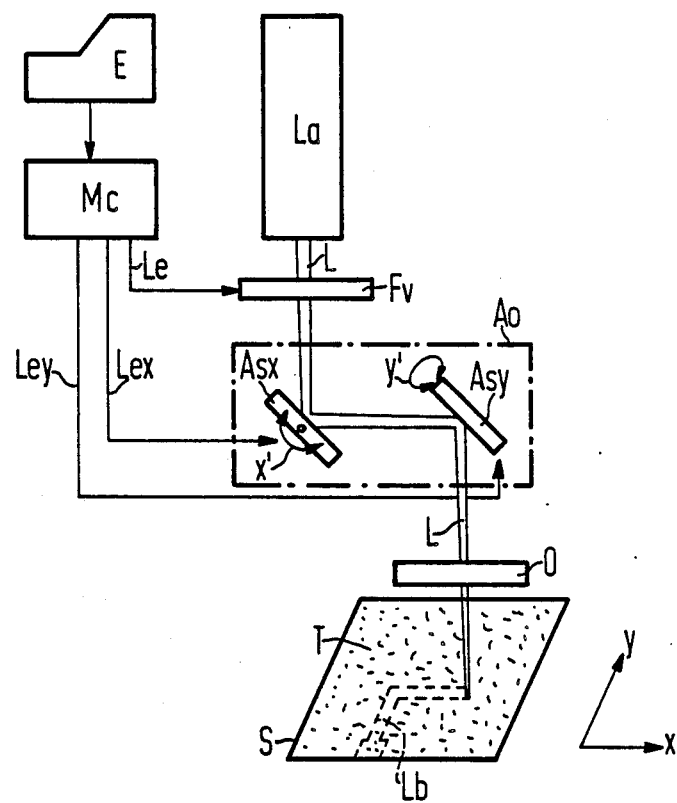
FIG. 1 illustrates a schematic representation of an embodiment of the method of the present invention.

FIG. 1 illustrates a highly simplified, schematic illustration of the present invention for transferring a conductor pattern onto a substrate. The substrate S can be, for example, composed of a thermoplastic synthetic. The illustrated substrate S is a portion of the base material for an injection molded printed circuit board. High-temperature-resistant thermoplastics such as for example, polyetherimide, polyethersulfone, polyphenylenesulfide, and liquid crystal polymers are particularly suitable as materials for such base materials.

Pursuant to the method of the present invention, a coating agent is applied to the surface of the substrate S. The coating agent includes a grainy carrier substance T that is indicated by tiny dots in FIG. 1. In an embodiment of the present invention, preferably, the coating agent is applied to the surface of the substrate S in a layer thickness of approximately 4 microns.

As illustrated, a laser La is utilized as an energy beam. The laser La generates a laser beam L in whose beam path a photographic shutter Fv, a first rotatable deflecting mirror Asx of a deflection optics Ao, a second rotatable deflecting mirror Asy of the deflection optics Ao, and an objective O are successively arranged. The mirrors Asx and Asy function to focus the laser beam onto the surface of the substrate S. The position of the substrate S is determined with reference to a planar, Cartesian x, y coordinate system. Accordingly, the first deflecting mirror Asx of the deflection optics Ao functions to deflect the laser beam L in the horizontal direction x; this is indicated in FIG. 1 by arrows x'. The second deflecting mirror Asy of the deflection optics Ao functions to deflect the laser beam L in the vertical direction y; this is indicated in FIG. 1 by arrow y'.

To control the deflecting mirrors Asx and Asy, a microcomputer Mc that has an input E is utilized. The microcomputer Mc therefore determines the conductor pattern to be produced on the substrate. The lines for the control of the deflecting mirrors Asx and Asy are indicated by Lex and Ley, respectively. The microcomputer Mc also controls the photographic shutter Fv; this is indicated by a corresponding line Le.

A variety of lasers La can be utilized in the present invention. For example, the laser La can be a $CO_2$ laser which is utilized in continuous wave mode or which can also be electronically pulsed, whereby the mean power lies between approximately 0.5 watts to about 8 watts. The laser La can also be, for example, a Nd-YAG laser having a mean power between approximately 0.2 watts to about 50 watts. The focussing of the laser beam L is adjustable, whereby the diameter of the laser beam L at the substrate surface can be set to diameters of between approximately 50 microns to about 400 microns.

For transferring the conductor pattern to the substrate S, printing ink applied thereto is swept by the laser beam L, in accord with the interconnect configuration input, into the microcomputer Mc via the input E. The trace of the laser beam L in the transfer of the conductor pattern is illustrated in FIG. 1 as interconnect Lb. Further details of the transfer of conductor patterns through the method of the present invention will now be set forth in greater detail below with reference to FIGS. 2 through 5.

Figure 2:
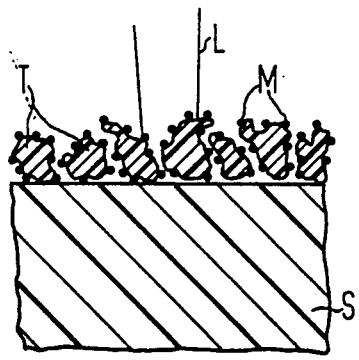
FIG. 2 illustrates a cross-sectional perspective view of the coating agent of the present invention applied to the substrate.

FIG. 2 illustrates a highly simplified, schematic illustration of a substrate S on whose surface the individual particles of the carrier substance T of the coating agent are uniformly distributed. As illustrated, the coating agent includes individual particles of metal M that are carried by the surface of the carrier substance T. Preferably, the carrier substance T is: activated carbon; conductive lamp black; calcium carbonate; diatomaceous earth; bentonite; kaolin; plastic; silica gel; aluminum oxide; titinium oxide; or pumice stone—either alone or in combination. Preferably, the metal M is chosen from the group of precious metals. In an embodiment, the metal is a precious metal alloy with a non-precious metal selected from the group consisting of: lead; zinc; nickel; tin; and copper.

Figure 3:
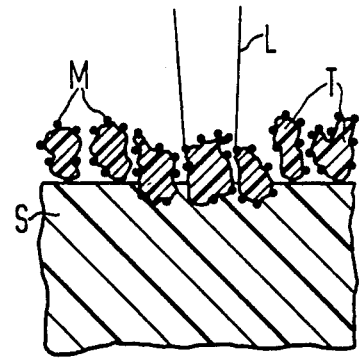
FIG. 3 illustrates a cross-sectional perspective view of the substrate of FIG. 2 having the carrier substance of the coating agent anchored therein.

As stated above, a laser beam L is used to create the conductor pattern on the substrate. To this end, the laser beam L is guided over the surface of the substrate S in the conductor pattern desired to be produced. The laser beam L creates a superficial melting of the substrate. As illustrated in FIG. 3, this melting effects a secure anchoring of the carrier substance T in the region of the desired conductor image.

Figure 4:
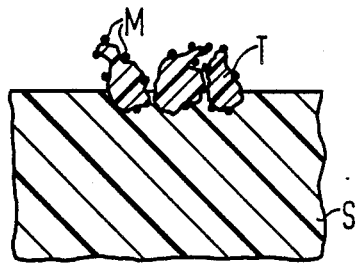
FIG. 4 illustrates a cross-sectional perspective view of the conductor pattern transferred via the steps illustrated in FIGS. 2 and 3 and anchored in the substrate.

After the melting by the laser beam L, non-anchored carrier substance T is removed by brushing, spraying, or rinsing in an ultrasound bath or the like. Accordingly, as illustrated in FIG. 4, only anchored carrier substance T in the region of the conductor pattern to be produced remains on the substrate S. After removal of the non-anchored carrier substance T, the particles of metal M, present in a three-dimensional distribution on the anchored carrier substance T, serve as nuclei for the chemical metallization of the conductor pattern executed without external current. Therefore, the conductor pattern can be completely constructed by chemical metal deposition or by chemical and subsequent galvanic metal deposition.

Figure 5:
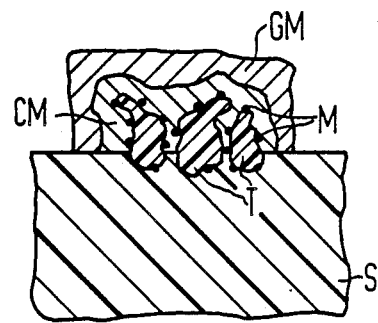
FIG. 5 illustrates a cross-sectional view of the conductor pattern of FIG. 4 following a chemical and galvanic metallization.

FIG. 5 illustrates the construction of the conductor pattern by chemical and subsequent galvanic metal deposition. In FIG. 5, the chemically deposited metal is referenced by CM and the galvanically deposited metal is referenced by GM. In an embodiment of the present invention, preferably, copper is utilized for the chemically and galvanically deposited metals CM and GM, respectively.

Figure 6:
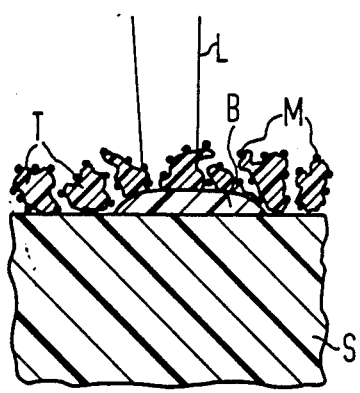
FIG. 6 illustrates a cross-sectional perspective view of an embodiment of the present invention wherein the coating agent contains a hot-melt adhesive as a bonding agent.
Figure 7:
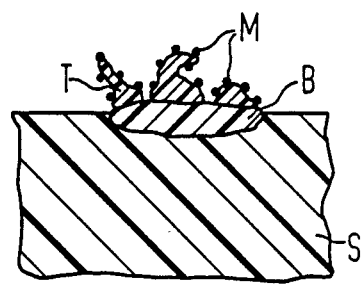
FIG. 7 illustrates across-sectional perspective view of the anchoring of the conductor pattern in the substrate of FIG. 6.

FIGS. 6 and 7 illustrate another embodiment of the method of the present invention. In this embodiment, the carrier substance T is saturated with a hot-melt adhesive as the bonding agent. This bonding agent then melts under the influence of the laser beam L and, as illustrated in FIG. 6, leads to a gluing of the carrier substance T to the surface of the substrate S.

In this embodiment, preferably a thermoplastic synthetic is again utilized as the substrate S. A heat-treatment can be carried out after the removal of the unglued carrier substance T. This heat-treatment, as illustrated in FIG. 7, leads to a fusing into the substrate surface and an even better anchoring of the carrier substance T in the region of the desired conductor pattern.

By way of example, microwaves can be used for the heat-treatment step. Polar polymers having a high dielectric constant have been found to function satisfactorily as the bonding agent with microwaves. When polar polymers with a high dielectric constant are utilized as the bonding agent, the microwaves will only influence the substrate. Accordingly, with microwaves a deformation of the substrate occasioned by the heat-treatment can be reliably suppressed.

Preferably, the bonding agent comprises at least one compound chosen from the group consisting of: polyamides; polyimides; colophonium resins; hydrocarbon resins; ketone resins; polyvinylether; maleic resin; and polyvinyl buteral. In an embodiment of the method of the present invention, preferably, polyamide and polyimide are utilized as the polar polymers for the bonding agent to be treated with microwaves.

By way of example, and not limitation, examples of the method and coating of the present invention will now be given.

EXAMPLE 1

A coating agent in accordance with the present invention was made as follows. A carrier catalyst composed of activated carbon having palladium applied thereto was utilized. Approximately 10 weight percent palladium was distributed on approximately 90 weight percent activated carbon. The activated carbon having the palladium applied thereto was present in fine-grained form. Approximately 30 percent of the grains had a grain size below 10 microns; approximately 85 percent of the grains had a grain size under 50 microns; and approximately 98 percent of the grains had a grain size under 100 microns.

The coating agent manufactured therewith contained the following constituents: approximately 30 weight percent activated carbon plus palladium; approximately 2 weight percent yellow pigment; approximately 25 to about 30 weight percent bonding agent; approximately 1.5 weight percent of a thixotroping agent; and the remainder of the coating agent consisted of a solvent. Although ethanol was used as the solvent, the solvent can include at least one organic solvent chosen from the group consisting of: alcohols; esters; ketones; and hydrocarbons both aliphates and aromatics. A mixture of maleic resin and polyvinyl butyral was used as the bonding agent.

The coating agent described above, was applied to a substrate of polyethersulphone by immersion. The transfer of a conductor pattern was carried out utilizing the process illustrated in FIG. 1 with the assistance of a laser beam. Subsequently, the excess coating agent was removed in an ultrasound cleaning bath utilizing isobutyl methylketone as the cleaning fluid. The conductor pattern was then built up through copper deposition working without external current. The copper was built up to a layer thickness of approximately 2 microns. The conductor pattern was then built up through galvanic copper deposition, being built up therewith to a layer thickness of approximately 33 microns to produce an electrically conductive printed pattern on the substrate.

EXAMPLE 2

In this example, the steps and procedures set forth above for example 1 were carried out except the activated carbon with the palladium applied thereto was replaced by a finer-grained substance of carbon with palladium having a mean grain size of about 4 microns. The resultant coating agent was then applied to the substrate by being sprayed on the substrate to a layer thickness of approximately 4 to about 5 microns to produce an electrically conductive printed pattern on the substrate.

EXAMPLE 3

In this example, the steps and procedures set forth in example 2 above were followed except calcium carbonate was substituted for the activated carbon in the coating agent.

EXAMPLE 4

In this example, the steps and procedures set forth in example 2 above were followed except the ratio of the activated carbon to palladium in the coating agent was modified. Instead of the weight ratio of approximately 10 weight percent palladium to approximately 90 weight percent activated carbon, approximately 97 weight percent of activated carbon was utilized as the carrier to approximately 3 weight percent of palladium.

EXAMPLE 5

In this example, the steps and procedures set forth in example 3 were followed, however, the weight ratio of calcium carbonate to palladium wa modified. Instead of the weight ratio of approximately 10 weight percent palladium to approximately 90 weight percent calcium carbonate, approximately 97 weight percent of calcium carbonate served as the carrier for approximately 3 weight percent palladium.

EXAMPLE 6

In this example, the steps and procedures of example 4 were followed except platinum was substituted for the palladium used in the coating agent of example 4.

EXAMPLE 7

In this example, the steps and procedures of example 5 were followed except platinum was substituted for the palladium used in the coating agent of example 5.

EXAMPLE 8

In this example, the steps of example 1 were followed, however, after the removal of the excess coating agent an after-treatment in an ammonia chloride bath was performed. This after-treatment led to a significant improvement in the adhesion of the interconnects to the substrate.

The after-treatment with a suitable bath can also be utilized in the methods set forth in examples 2 through 7. In utilizing the after-treatment with the steps and method of example 2, the after-treatment with ammonia chloride led to an adhesion of the interconnects of about 1 N/nm$_2$.

EXAMPLE 9

In this example, the steps and procedures of example 1 were followed, however, the activated carbon of the coating agent was replaced by conductive lampblack. Whereas irregularities in the interconnect structure can occur when activated carbon is utilized, when the grain is excessively large because of the electrically non-conductive characteristic of the carbon, the conductivity continues to exist at this location as a result of the use of conductive lampblack; even though the conductivity is less than in the case of metals. The conductive lampblack thus does not replace the metal. Rather, it augments the function of the metals as nuclei for the following, currentless metallization.

EXAMPLE 10

In this example, the steps and procedures of example 1 were followed, but the activated carbon of the coating agent in example 1 was replaced by a plastic on an acrylate basis.

EXAMPLE 11

In this example, the steps and procedures of example 1 were followed, however, the activated carbon of the coating agent was replaced by the plastic compound of the substrate. For example, given a substrate and carrier composed of polyetherimide, an extremely high adhesion of the interconnects to the substrate was achieved.

EXAMPLE 12

Following the steps and procedures of example 1, a powdery coating agent composed only of the carrier catalyst, i.e., of activated carbon and palladium, was used. This coating agent was strewn onto the substrate, and was anchored with a laser beam in accordance with the conductor pattern. The substrate and coating agent was then chemically and, as needed, galvanically copper-plated. The soldering of the substrate was thereby improved.

EXAMPLE 13

In this example, the steps and procedures of example 1 were followed, however, the coating agent was first applied to a foil that served as an intermediate carrier. The foil was then placed onto the substrate, whereupon the conductor pattern was transferred onto the substrate through the foil with a laser.

EXAMPLE 14

In this example, the steps and procedures of example 1 were followed, but, the activated carbon of the coating agent was replaced by a plastic-bonded catalyst.

EXAMPLE 15

In this example, the steps and procedures of example 14 were followed except a ground ion exchanger was used as a plastic-bonded catalyst, a palladium (salt) solution having been introduced thereinto and the palladium having been subsequently chemically reduced to 0-valent palladium.

EXAMPLE 16

In this example, the steps and procedures of example 14 were followed, but, a ground expanded polymer having a large surface was used as a plastic-bonded catalyst, the palladium having been deposited thereon. The expanded polymer to be utilized can either be open-celled or closed-celled.

EXAMPLE 17

In this example, the steps and procedures of example 14 were followed, but, a polymer-bonded palladium catalyst was used as a plastic-bonded catalyst. The palladium can be bonded chelate-like or salt-like, such as polyamines or polyacrylic acid, and can be reduced on the polymer to 0-valent palladium. The resultant product can still be subsequently soluble and can then be applied to the substrate as a solution. If the resultant product is insoluble, it can first be ground and then be applied to the substrate.

Sediment grinding can be utilized for grinding the plastics to form micron-sized particles given the utilization of plastic-bonded catalysts. The polymers are then mixed with an inorganic salt. The polymers, due to electro-static charging, would adhere to one another if the salt was not present. The salt prevents the adhesion of the polymers to one another and is in turn dissolved out with water after the grinding.

It should be noted that the anchoring of the conductor pattern on the substrate can be potentially enhanced through the use of heat. For example, given the employment of substrates composed of polyetherimide, such a tempering step performed after the galvanic copper-plating increased the adhesion of the conductor pattern to the substrate by up to 50 percent.

It should be understood that various changes and modifications to the presently preferred embodiments described herein will be apparent to those skilled in the art. Such changes and modifications can be made without departing from the spirit and scope of the present invention and without diminishing its attendant advantages. It is thereby intended that such changes and modifications be covered by the appended claims.

We claim:

1. A method for applying electrically conductive printed patterns to insulating substrates wherein a metal-containing coating agent is transferred onto a substrate under the influence of energy radiation in a printed pattern to be produced and is chemically metallized, the coating agent includes a non-metallic grainy carrier substance having metal of the oxidation degree 0 applied thereto.

2. The method of claim 1 wherein the carrier substance is constructed from a substance that has a structure that is fine-grained and surface-rich.

3. The method of claim 1 wherein the carrier substance comprises grains having a size of less than approximately 8 microns.

4. The method of claim 3 wherein the carrier substance comprises grains having a size greater than 1 micron.

5. The method of claim 1 wherein the carrier substance comprises grains having a size of between approximately 2 microns to about 4 microns.

6. The method of claim 1 wherein the carrier substance includes at least one compound chosen from the group consisting of: activated carbon, conductive lampblack, calcium carbonate, diatomaceous earth, bentonite, kaolin, silica gel, aluminum oxide, titanium oxide and pumice stone.

7. The method of claim 1 wherein the carrier is constructed from activated carbon.

8. The method of claim 1 wherein the carrier is constructed from calcium carbonate.

9. The method of claim 1 wherein the carrier is constructed from a plastic.

10. The method of claim 9 wherein the plastic is on an acrylate basis.

11. The method of claim 1 wherein the carrier substance is constructed from the same material as the substrate.

12. The method of claim 1 wherein the coating agent comprises approximately 0.01 to about 10 weight percent metal and approximately 90 to about 99.9 weight percent carrier substance.

13. The method of claim 1 wherein the metal is chosen from the group consisting of the precious metals.

14. The method of claim 13 wherein the metal is palladium.

15. The method of claim 13 wherein the metal is platinum.

16. The method of claim 1 wherein the metal is a precious metal alloy.

17. The method of claim 16 wherein the metal is a precious metal alloy with a non-precious metal chosen from the group consisting of lead, zinc, nickel, tin, and copper.

18. The method of claim 1 wherein the coating agent contains at least one bonding agent.

19. The method of claim 18 wherein the coating agent includes at least one bonding agent chosen from the group consisting of polyamides, polyimides, colophonium resins, hydrocarbon resins, ketone resins, and polyvinylether.

20. The method of claim 18 wherein the bonding agent includes at least one compound chosen from the group consisting of maleic resin and polyvinyl butyral.

21. The method of claim 18 wherein the bonding agent is a hot-melt adhesive.

22. The method of claim 18 wherein the carrier substance is saturated with the bonding agent 23. The method of claim 1 wherein the coating agent includes at least one solvent.

24. The method of claim 23 wherein the coating agent includes at least one organic solvent.

25. The method of claim 24 wherein the organic solvent is chosen from the group consisting of alcohols, esters, ketones, and hydrocarbons both aliphates and aromatics.

26. The method of claim 23 wherein the coating agent includes at least one thixotroping agent.

27. The method of claim 1 wherein the coating agent is applied to the substrate in a layer thickness of between approximately 4 microns to about 5 microns.

28. The method of claim 23 wherein the coating agent is applied to the substrate by emersion.

29. The method of claim 23 wherein printing ink is applied to the substrate by spraying.

30. The method of claim 1 wherein the coating agent is anchored to the substrate by use of an energy beam deflectable in accord with a printed pattern to be generated.

31. The method of claim 30 wherein a laser beam is employed as an energy beam.

32. The method of claim 31 wherein the laser beam is generated with a $CO_2$ laser.

33. The method of claim 32 wherein the $CO_2$ laser is operated with a mean power of between approximately 0.5 watts to about 8 watts.

34. The method of claim 31 wherein the laser beam is generated with a Nd-YAG laser.

35. The method of claim 34 wherein the Nd-YAG laser is operated with a mean power of between approximately 0.2 watts to about 50 watts.

36. The method of claim 31 wherein the laser beam is focussed such that its diameter at the surface of the substrate lies between approximately 50 microns to about 400 microns.

37. The method of claim 1 wherein after the transfer of a printed pattern excess coating agent is removed from the surface of the substrate.

38. The method of claim 37 wherein the excess coating agent is removed with the assistance of a cleaning fluid.

39. The method of claim 38 wherein an organic solvent is used as the cleaning fluid.

40. The method of claim 38 wherein the excess coating agent is removed in an ultrasound bath.

41. The method of claim 39 wherein isobutylmethylketone is used as the cleaning fluid.

42. The method of claim 40 wherein after the removal of the excess coating agent, the anchoring of the printed pattern on the substrate is enhanced by applying heat to the printed pattern and substrate.

43. The method of claim 42 wherein the heat is generated by microwaves.

44. The method of claim 37 wherein after the removal of the excess coating agent, the anchoring of the printed pattern on the substrate is enhanced via a chemical after-treatment.

45. The method of claim 44 wherein the chemical after-treatment is performed in an ammonia chloride bath.

46. The method of claim 1 wherein a printed pattern transferred onto the substrate is completely built-up by chemical metal deposition.

47. The method of claim 1 wherein a printed pattern transferred onto the substrate is built-up by chemical and subsequent galvanic metal deposition.

48. The method of claim 46 wherein the printed pattern transferred onto the substrate is built-up by the deposition of copper.

49. The method of claim 47 wherein the printed pattern transferred onto the substrate is built-up by the deposition of copper.

* * * * *